(12) United States Patent
Shirai et al.

(10) Patent No.: US 8,779,523 B2
(45) Date of Patent: Jul. 15, 2014

(54) SEMICONDUCTOR DEVICE

(75) Inventors: Koji Shirai, Kanagawa-ken (JP); Ken Inadumi, Kanagawa-ken (JP); Tsuyoshi Hirayu, Kanagawa-ken (JP); Toshihiro Sakamoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/491,909

(22) Filed: Jun. 8, 2012

(65) Prior Publication Data

US 2013/0181296 A1   Jul. 18, 2013

(30) Foreign Application Priority Data

Jan. 13, 2012   (JP) .................................. 2012-005127

(51) Int. Cl.
*H01L 29/76* (2006.01)
(52) U.S. Cl.
USPC ........... 257/369; 257/343; 257/344; 257/409; 438/199; 438/296
(58) Field of Classification Search
USPC .................. 257/343–344, 369, 409, E29.256, 257/E27.062; 438/199, 296
See application file for complete search history.

(56) References Cited

U.S. PATENT DOCUMENTS 7,541,247 B2 *   6/2009   Voldman ....................... 438/294

FOREIGN PATENT DOCUMENTS

JP   2010-199424   9/2010

* cited by examiner

*Primary Examiner* — Theresa T Doan
(74) *Attorney, Agent, or Firm* — Patterson & Sheridan, LLP

(57) ABSTRACT

According to one embodiment, a semiconductor device includes a semiconductor substrate with a p-type conductivity, a buried layer with an n-type conductivity provided on the semiconductor substrate, a back gate layer with a p-type conductivity provided on the buried layer, a drain layer with an n-type conductivity provided on the back gate layer, a source layer with an n-type conductivity provided spaced from the drain layer, a gate electrode provided in a region immediately above a portion of the back gate layer between the drain layer and the source layer, and a drain electrode in contact with a part of an upper surface of the drain layer. A thickness of the drain layer in a region immediately below a contact surface between the drain layer and the drain electrode is half a total thickness of the back gate and drain layers in the region.

5 Claims, 2 Drawing Sheets

SEMICONDUCTOR DEVICE

CROSS-REFERENCE TO RELATED APPLICATIONS

This application is based upon and claims the benefit of priority from the prior Japanese Patent Application No. 2012-005127, filed on Jan. 13, 2012; the entire contents of which are incorporated herein by reference.

FIELD

Embodiments described herein relate generally to a semiconductor device.

BACKGROUND

Conventionally, in a horizontal DMOS (Double-Diffused Metal-Oxide-semiconductor Field Effect Transistor) the drain layer has been separated into a drift layer that mainly passes a current and a drain buffer layer that mainly ensures a breakdown voltage. Since they have been controlled separately, it has been difficult to achieve both an increase in breakdown voltage and an improvement in current performance per unit area. In the case where only the drift layer is provided and the drain buffer layer is not provided, it has been difficult to improve the breakdown voltage; and in the case where the necessary breakdown voltage is ensured, the element area has tended to be increased.

BRIEF DESCRIPTION OF THE DRAWINGS

FIG. 2A shows the nMOS region and FIG. 2B shows the pMOS region.

DETAILED DESCRIPTION

According to one embodiment, a semiconductor device includes a semiconductor substrate with a conductivity of a p-type, a buried layer with a conductivity of an n-type provided on the semiconductor substrate, a back gate layer with a conductivity of a p-type provided on the buried layer, a drain layer with a conductivity of an n-type provided on the back gate layer, a source layer with a conductivity of an n-type provided spaced from the drain layer on the back gate layer, a gate electrode provided in a region immediately above a portion of the back gate layer between the drain layer and the source layer, and a drain electrode in contact with a part of an upper surface of the drain layer. A thickness of the drain layer in a region immediately below a contact surface between the drain layer and the drain electrode is half a total thickness of the back gate layer and the drain layer in the region immediately below the contact surface.

According to one embodiment, a semiconductor device includes a semiconductor substrate with a conductivity of a p-type, a buried layer with a conductivity of an n-type provided on the semiconductor substrate, a first back gate layer with a conductivity of a p-type provided on the buried layer, a first drain layer with a conductivity of an n-type provided on the first back gate layer, a first source layer with a conductivity of an n-type provided spaced from the first drain layer on the first back gate layer, a first gate electrode provided in a region immediately above a portion of the first back gate layer between the first drain layer and the first source layer, a second back gate layer with a conductivity of an n-type provided on the buried layer, a second drain layer with a conductivity of a p-type provided on the second back gate layer, a second source layer with a conductivity of a p-type provided spaced from the second drain layer on the second back gate layer, and a second gate electrode provided in a region immediately above a portion of the second back gate layer between the second drain layer and the second source layer. A lower end of the second drain layer is located below a lower end of the first drain layer.

Various embodiments will be described hereinafter with reference to the accompanying drawings.

Figure 1:
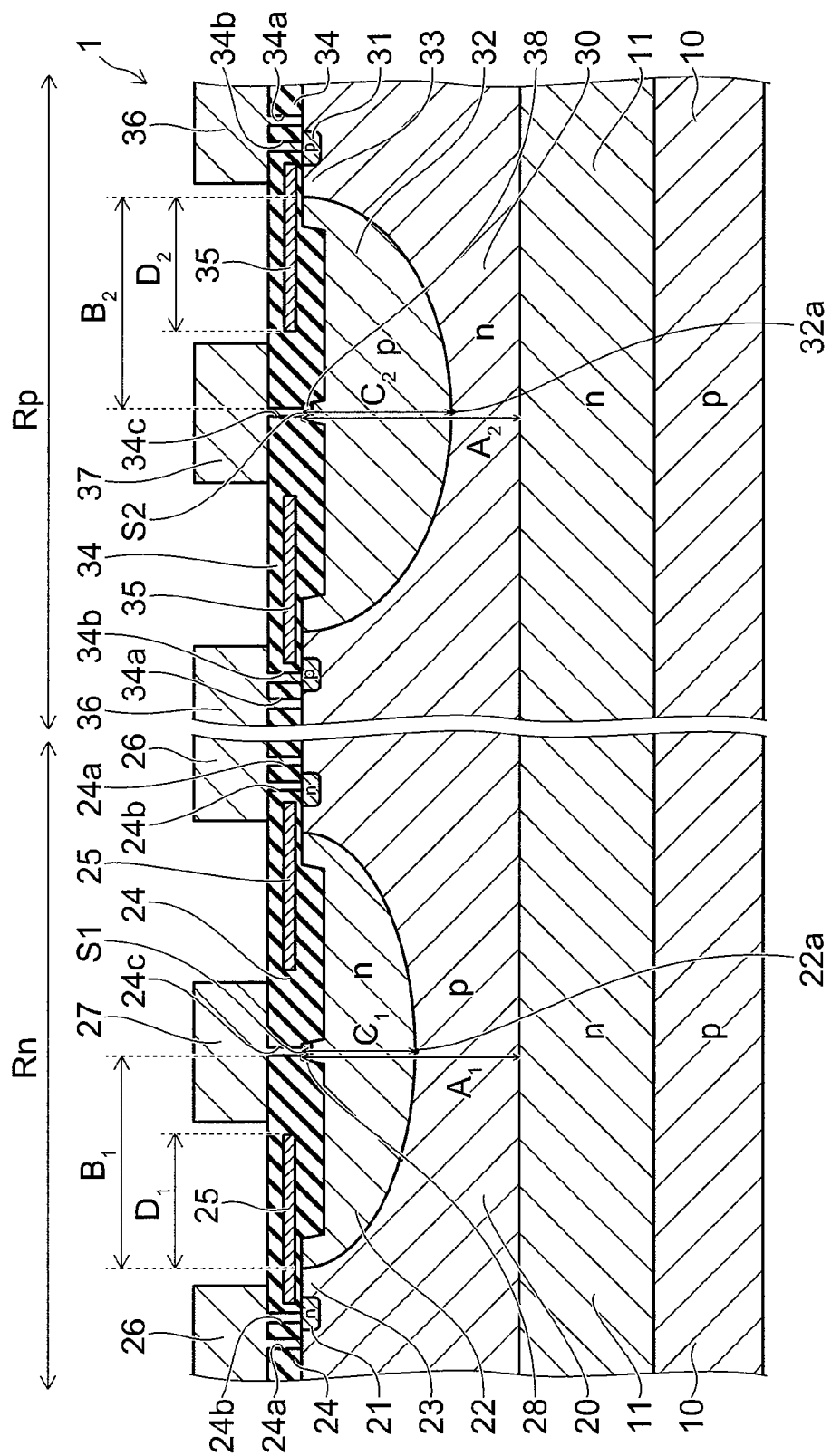
FIG. 1 is a cross-sectional view illustrating a semiconductor device according to an embodiment.

FIG. 1 is a cross-sectional view illustrating a semiconductor device according to the embodiment.

Figure 2A:
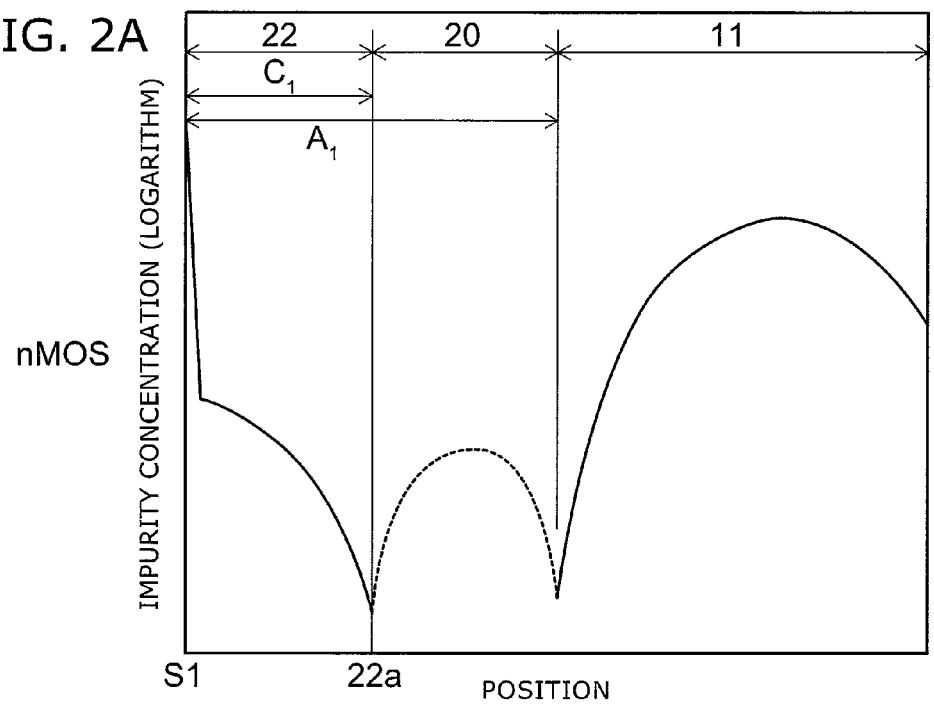
FIGS. 2A and 2B are graphs illustrating impurity concentration profiles with the position in the vertical direction on the horizontal axis and the effective impurity concentration on the vertical axis, where
Figure 2B:
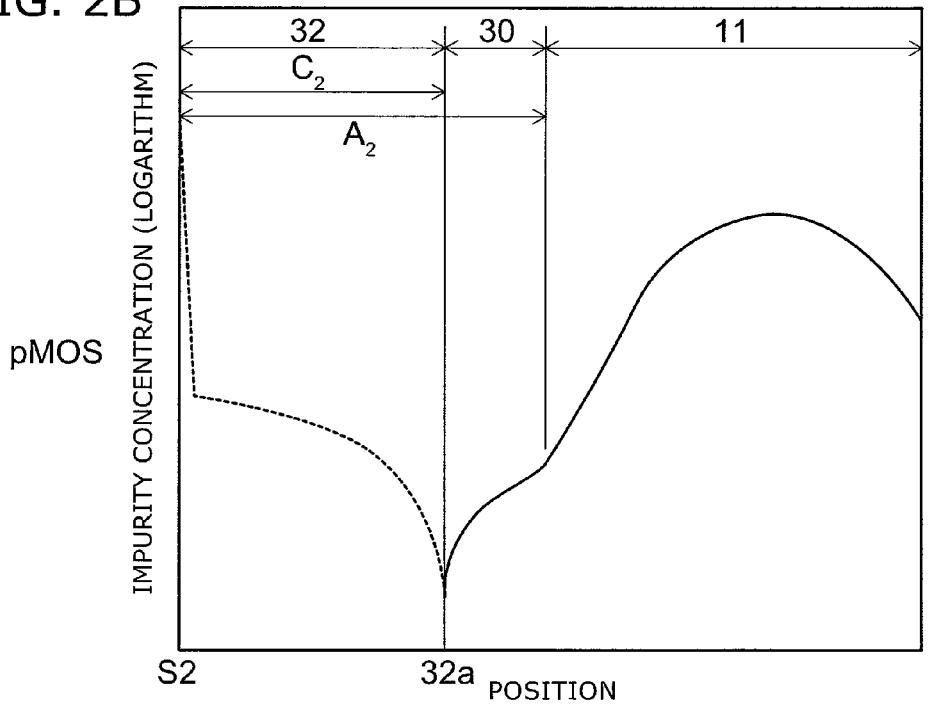

FIGS. 2A and 2B are graphs illustrating impurity concentration profiles with the position in the vertical direction on the horizontal axis and the effective impurity concentration on the vertical axis, where FIG. 2A shows the nMOS region and FIG. 2B shows the pMOS region.

In FIGS. 2A and 2B, the solid line indicates the n-type portion and the broken line indicates the p-type portion.

In the specification, the "effective impurity concentration" refers to the concentration of the impurity/impurities contributing to the conductivity of a semiconductor material. For example, in the case where both an impurity serving as a donor and an impurity serving as an acceptor are contained in the semiconductor material, the effective impurity concentration refers to the concentration of the amount excluding the amount of offset between the donor and the acceptor.

As shown in FIG. 1, a semiconductor device 1 according to the embodiment includes a semiconductor substrate 10 with a conductivity of the p-type. A buried layer 11 with a conductivity of the n-type is provided on the semiconductor substrate 10. The semiconductor substrate 10 is, for example, a single-crystal silicon substrate, and the buried layer 11 is provided by, for example, diffusing an n-type impurity (an impurity serving as a donor) at the surface of the semiconductor substrate 10.

An nMOS region Rn and a pMOS region Rp are defined in the semiconductor device 1. The semiconductor substrate 10 and the buried layer 11 are continuously provided in the nMOS region Rn and the pMOS region Rp. That is, in the direction perpendicular to the upper surface of the semiconductor substrate 10 (the vertical direction), the upper surface of the semiconductor substrate 10 and the upper surface of the buried layer 11 are located at the same position in the nMOS region Rn and the pMOS region Rp.

In the nMOS region Rn, a back gate layer 20 with a conductivity of the p-type is provided on the buried layer 11. A source layer 21 and a drain layer 22 with a conductivity of the n-type are formed spaced from each other on the back gate layer 20. For example, the source layer 21 is formed in two positions opposite each other across the drain layer 22. The source layer 21 and the drain layer 22 have a stripe shape extending in the direction perpendicular to the drawing sheet of FIG. 1. A portion of the back gate layer 20 between the source layer 21 and the drain layer 22 forms a channel region 23. The back gate layer 20, the source layer 21, the drain layer 22, and a drain contact layer 28 described later are, for example, formed in an n-type silicon layer epitaxially grown on the semiconductor substrate 10.

An insulating film 24 is provided on a silicon portion composed of the back gate layer 20, the source layer 21, and the drain layer 22. A gate electrode 25 is buried in the insulating film 24. A portion of the insulating film 24 between the silicon portion and the gate electrode 25 functions as a gate insulating film. Part of the gate electrode 25 is disposed in a region immediately above the channel region 23.

Openings 24a, 24b, and 24c are formed in parts of regions of the insulating film 24 immediately above the back gate layer 20, the source layer 21, and the drain layer 22, respectively. A source electrode 26 is provided in a region on the insulating film 24 including regions immediately above the openings 24a and 24b. The source electrode 26 is connected to the back gate layer 20 via the opening 24a, and is connected to the source layer 21 via the opening 24b.

A drain electrode 27 is provided in a region on the insulating film 24 including a region immediately above the opening 24c. The drain electrode 27 is connected to the drain layer 22 via the opening 24c. A drain contact layer 28 is formed in a portion of the drain layer 22 including a contact surface S1 in contact with the drain electrode 27. The conductivity type of the drain contact layer 28 is the n-type, and the effective impurity concentration thereof is higher than the effective impurity concentration of the drain layer 22.

The gate electrode 25 extends from a region immediately above the channel region 23 toward the contact surface S1. The drain layer 22 is deepest in a region immediately below the contact surface S1, and becomes continuously shallower toward the source layers 21 on both sides. Thereby, the outer edge of the drain layer 22 has a shape with an arc convex downward, and the lower end 22a thereof is located in a region immediately below the contact surface 51. Thus, an n-channel MOSFET is formed in the nMOS region Rn.

Similarly, a p-channel MOSFET is formed in the pMOS region Rp. However, the conductivity types of the back gate layer, the source layer, the drain layer, and the drain contact layer are opposite to those of the n-channel MOSFET described above. Furthermore, the depth of the drain layer formed is different. On the other hand, the semiconductor substrate 10 and the buried layer 11 are in common with the n-channel MOSFET.

That is, in the pMOS region Rp, a back gate layer 30 with a conductivity of the n-type is provided on the buried layer 11. A source layer 31 and a drain layer 32 with a conductivity of the p-type are formed spaced from each other on the back gate layer 30. A portion of the back gate layer 30 between the source layer 31 and the drain layer 32 forms a channel region 33. The back gate layer 30, the source layer 31, the drain layer 32, and a drain contact layer 38 described later are, for example, formed in an n-type silicon layer epitaxially grown on the semiconductor substrate 10.

An insulating film 34 is provided on a silicon portion composed of the back gate layer 30, the source layer 31, and the drain layer 32, and a gate electrode 35 is buried in the insulating film 34. Part of the gate electrode 35 is disposed in a region immediately above the channel region 33.

Openings 34a, 34b, and 34c are formed in parts of regions of the insulating film 34 immediately above the back gate layer 30, the source layer 31, and the drain layer 32, respectively. A source electrode 36 is provided in a region on the insulating film 34 including regions immediately above the openings 34a and 34b. A drain electrode 37 is provided in a region on the insulating film 34 including a region immediately above the opening 34c.

The source electrode 36 is connected to the back gate layer 30 via the opening 34a, and is connected to the source layer 31 via the opening 34b. The drain electrode 37 is connected to the drain layer 32 via the opening 34c. A drain contact layer 38 is formed in a portion of the drain layer 32 including a contact surface S2 in contact with the drain electrode 37. The conductivity type of the drain contact layer 38 is the p-type, and the effective impurity concentration thereof is higher than the effective impurity concentration of the drain layer 32.

The gate electrode 35 extends from a region immediately above the channel region 33 toward the contact surface S2. The drain layer 32 is deepest in a region immediately below the contact surface S2, and becomes continuously shallower toward the source layers 31. Thereby, the outer edge of the drain layer 32 has a shape with an arc convex downward, and the lower end 32a thereof is located in a region immediately below the contact surface S2. However, as described later, the maximum depth of the drain layer 32 is deeper than the maximum depth of the drain layer 22.

Thus, in the semiconductor device 1, an n-type MOSFET and a p-type MOSFET are formed on the common semiconductor substrate 10 and the common buried layer 11. The semiconductor device 1 according to the embodiment is, for example, an analog power integrated circuit. The n-type MOSFET and the p-type MOSFET described above constitute, for example, an output circuit with a high breakdown voltage.

Next, the relationships among dimensions of portions are described.

As shown in FIG. 1 and FIGS. 2A and 2B, in the nMOS region Rn, the thickness $C_1$ of the drain layer 22 in a region immediately below the contact surface S1 between the drain layer 22 and the drain electrode 27 is half the total thickness $A_1$ of the back gate layer 20 and the drain layer 22 in the region immediately below the contact surface S1. That is, $C_1=A_1/2$.

The back gate layer 20, the source layers 21 and 31, and the drain layers 22 and 32 are, for example, an impurity diffusion layer formed by ion-implanting an impurity into an epitaxial layer. A region of the epitaxial layer where the impurity is not substantially ion-implanted forms the back gate layer 30. As shown in FIG. 2A, in the region immediately below the contact surface S1, the dose amount of the drain layer 22 is equal to the dose amount of the back gate layer 20.

Furthermore, in the direction parallel to the upper surface of the semiconductor substrate 10 (horizontal direction), the length $B_1$ between an end edge of the drain layer 22 on the source layer 21 side and the contact surface S1 is equal to the total thickness $A_1$ of the back gate layer 20 and the drain layer 22 in the region immediately below the contact surface S1. That is, $B_1=A_1$.

Moreover, the length $D_1$ of a portion of the gate electrode 25 extending in a region immediately above the drain layer 22 is longer than half the length $B_1$ described above, for example, ⅔ of the length $B_1$. That is, $D_1>B_1/2$, for example, $D_1=2B_1/3$.

The lower end 32a of the drain layer 32 is located below the lower end 22a of the drain layer 22. On the other hand, the upper end of the drain layer 32 and the upper end of the drain layer 22 are at the same height. That is, the thickness $C_2$ of the drain layer 32 in a region immediately below the contact surface S2 between the drain layer 32 and the drain electrode 37 is thicker than the thickness $C_1$ of the drain layer 22 in the region immediately below the contact surface S1. That is, $C_2>C_1$.

Furthermore, also in the pMOS region Rp, similarly to the nMOS region Rn, in the horizontal direction, the length $B_2$ between an end edge of the drain layer 32 on the source layer 31 side and the contact surface S2 is equal to the total thickness $A_2$ of the back gate layer 30 and the drain layer 32 in the region immediately below the contact surface S2. That is, $B_2=A_2$. Furthermore, the thickness $A_1$ and the thickness $A_2$ are equal to each other. That is, $A_1=A_2$.

Moreover, the length $D_2$ of a portion of the gate electrode 35 extending in a region immediately above the drain layer 32 is longer than half the length $B_2$ described above, for example, ⅔ of the length $B_2$. That is, $D_2 > B_2/2$, for example, $D_2 = 2B_2/3$.

The relationships described above are summarized as follows:

$A_1 = A_2 = B_1 = B_2$
$C_1 = A_1/2$
$C_2 > C_1$
$D_1 > B_1/2$, for example, $D_1 = 2B_1/3$
$D_2 > B_2/2$, for example, $D_2 = 2B_2/3$ The thicknesses $A_1$ and $A_2$ are, for example, 2 to 6 μm, for example, 4 μm. The dose amount of the back gate layer 20 and the drain layer 22 is, for example, $3 \times 10^{12}$ cm$^{-2}$. Furthermore, the acceleration voltage of the ion implantation in forming the back gate layer 20 is, for example, 2 MV, and the acceleration voltage of the ion implantation in forming the drain layer 22 is, for example, 1 MV. Thereby, the semiconductor device 1 can achieve, for example, a breakdown voltage of approximately 50 to 60 V.

Next, operations and effects of the semiconductor device according to the embodiment are described.

In the n-channel MOSFET, a negative electrode potential is applied to the source electrode 26, and a positive electrode potential is applied to the drain electrode 27; thereby, a prescribed voltage is supplied between source and drain. In this state, the same potential as the source electrode 26 is applied to the gate electrode 25. The buried layer 11 is set in a floating state. Thereby, the n-channel MOSFET is switched to the OFF state, and a depletion layer is generated from the interface between the back gate layer 20 and the drain layer 22. At this time, at the lower surface of the drain layer 22, the depletion layer extends both upward and downward. On the other hand, at the side surface of the drain layer 22, the depletion layer extends mainly toward the inside of the drain layer 22.

In the embodiment, in the region immediately below the contact surface S1, the dose amount of the back gate layer 20 and the dose amount of the drain layer 22 are equal. Therefore, when the voltage between source and drain is increased, the depletion layer generated from the interface between the back gate layer 20 and the drain layer 22 reaches the buried layer 11 and the drain contact layer 28 almost simultaneously, and breakdown occurs. That is, there is no case where a depletion layer reaches one of the buried layer 11 and the drain contact layer 28 much more upstream than reaches the other, and the thickness $A_1$ can be used to the fullest as a space for a depletion layer to extend. Thereby, the breakdown voltage in the vertical direction can be improved.

At this time, since $C_1 = A_1/2$ holds in the region immediately below the contact surface S1, the average impurity concentration of the back gate layer 20 and the average impurity concentration of the drain layer 22 are equal to each other. Thereby, the depletion layer extends equally upward and downward from the interface between the back gate layer 20 and the drain layer 22, and the strengths of the electric fields formed in the back gate layer 20 and the drain layer 22 become almost equal. Consequently, the breakdown voltage is further improved.

On the other hand, the depletion layer generated at the side surface of the drain layer 22, that is, the surface opposed to the source layer 21 hardly extends into the back gate layer 20, and extends mainly into the drain layer 22. In the embodiment, since $A_1 = B_1$, the horizontal to vertical ratio of the shape of the depletion layer immediately before breakdown is almost 1:1. Thereby, the breakdown voltage in the horizontal direction, that is, the breakdown voltage between the source layer 21 and the drain layer 22 and the breakdown voltage in the vertical direction, that is, the breakdown voltage between the buried layer 11 and the drain layer 22 are almost equal, and there is no case where the breakdown voltage of one is significantly lower than the breakdown voltage of the other. Therefore, the breakdown voltage of the whole n-channel MOSFET can be kept high. Furthermore, since the length $B_1$ is set to the shortest length ($B_1 = A_1$) in the range ($B_1 \geq A_1$) where the breakdown voltage in the horizontal direction can be ensured as much as the breakdown voltage in the vertical direction, the ON resistance of the n-channel MOSFET can be suppressed, and high current performance can be ensured. Thus, in the embodiment, since $C_1 = A_1/2$ and $A_1 = B_1$ are employed, both high breakdown voltage and high current performance can be achieved for the n-channel MOSFET.

In the n-channel MOSFET of the embodiment, to satisfy the relationships of $C_1 = A_1/2$ and $A_1 = B_1$ described above, other design parameters, such as, for example, the dimensions and impurity concentrations of other portions, are adjusted. For example, the length $D_1$ of a portion of the gate electrode 25 extending toward the contact surface S1 may be set to half or more of the length $B_1$ of the drain layer 22 in the horizontal direction, that is, $D_1 > B_1/2$. Thereby, the extension of the depletion layer into the drain layer 22 is supported, and the breakdown voltage in the horizontal direction is ensured.

On the other hand, in the p-channel MOSFET, since the conductivity type of the back gate layer 30 is the n-type, which is the same as the conductivity type of the buried layer 11, no breakdown occurs in the vertical direction. Hence, the drain layer 32 can be made thick only with consideration of the ON current and without consideration of the breakdown voltage in the vertical direction. In the embodiment, the thickness $C_2$ of the drain layer 32 in the region immediately below the contact surface S2 is made thicker than the thickness $C_1$ of the drain layer 22 in the region immediately below the contact surface S1. That is, $C_2 > C_1$ is employed. Thereby, the ON resistance of the p-channel MOSFET can be reduced, and the current performance can be enhanced.

Furthermore, also in the p-channel MOSFET, $A_2 = B_2$ is employed. Thereby, similarly to the n-channel MOSFET, the current performance can be enhanced while the breakdown voltage in the horizontal direction is ensured.

Thus, in the semiconductor device 1 according to the embodiment, by optimizing the dimensional ratios of portions, both the breakdown voltage and the current performance can be obtained at a high level. In other words, the area of the n-channel MOSFET and the p-channel MOSFET can be reduced while the breakdown voltage and the current performance (ON resistance) are kept at a certain level. Consequently, the cost of the semiconductor device can be reduced, and further the power consumption can be reduced.

When the semiconductor device 1 is manufactured actually, a variation may be caused in dimensions and dose amounts due to variations in process conditions etc. However, the inventors's investigation has revealed that the effects described above can be obtained when the range of variation is within ±20%. The range of variation is preferably made within ±10%.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a semiconductor substrate with a conductivity of a p-type;
a buried layer with a conductivity of an n-type provided on the semiconductor substrate;
a back gate layer with a conductivity of a p-type provided on the buried layer;
a drain layer with a conductivity of an n-type provided on the back gate layer;
a source layer with a conductivity of an n-type provided on the back gate layer, the source layer being spaced from the drain layer;
a gate electrode provided in a region immediately above a portion of the back gate layer between the drain layer and the source layer; and
a drain electrode having a lower surface that is in contact with a part of an upper surface of the drain layer,
a thickness of the drain layer in a region between the part of the upper surface of the drain layer and the back gate layer in a first direction orthogonal to a surface of the semiconductor substrate being half a combined thickness of the back gate layer and the drain layer between the part of the upper surface of the drain layer and an interface of the buried layer and the back gate layer in the first direction, and
an impurity concentration profile of the buried layer having a maximum value at a position other than at the interface of the buried layer and the back gate layer.

2. The device according to claim 1, wherein a length between an end edge of the drain layer on a side facing the source layer and the contact surface in a direction parallel to an upper surface of the semiconductor substrate is equal to the total thickness of the back gate layer and the drain layer in the region immediately below the contact surface.

3. The device according to claim 1, wherein the gate electrode extends toward the contact surface in a region immediately above the drain layer and a length of a portion of the extension is longer than half a length between an end edge of the drain layer on a side facing the source layer and the contact surface.

4. The device according to claim 1, wherein a dose amount of the drain layer is equal to a dose amount of the back gate layer in the region immediately below the contact surface.

5. A semiconductor device comprising:
a semiconductor substrate with a conductivity of a p-type;
a buried layer with a conductivity of an n-type provided on the semiconductor substrate;
a first back gate layer with a conductivity of a p-type provided on the buried layer;
a first drain layer with a conductivity of an n-type provided on the first back gate layer;
a first source layer with a conductivity of an n-type provided on the first back gate layer, the first source layer being spaced from the first drain layer;
a first gate electrode provided in a region immediately above a portion of the first back gate layer between the first drain layer and the first source layer;
a first drain electrode in contact with a part of an upper surface of the first drain layer;
a second back gate layer with a conductivity of an n-type provided on the buried layer;
a second drain layer with a conductivity of a p-type provided on the second back gate layer;
a second source layer with a conductivity of a p-type provided on the second back gate layer, the second source layer being spaced from the second drain layer;
a second gate electrode provided in a region immediately above a portion of the second back gate layer between the second drain layer and the second source layer; and
a second drain electrode in contact with a part of an upper surface of the second drain layer,
a lower end of the second drain layer being located below a lower end of the first drain layer,
a thickness of the first drain layer in a region immediately below a first contact surface between the first drain layer and the first drain electrode being half a total thickness of the first back gate layer and the first drain layer in the region immediately below the first contact surface,
a length between an end edge of the first drain layer on a side facing the first source layer and the first contact surface in a direction parallel to an upper surface of the semiconductor substrate being equal to the total thickness of the first back gate layer and the first drain layer in the region immediately below the first contact surface,
the first gate electrode extending toward the first contact surface in a region immediately above the first drain layer and a length of a portion of the extension being longer than half the length between the end edge of the first drain layer on the side facing the first source layer and the first contact surface,
a dose amount of the first drain layer being equal to a dose amount of the first back gate layer in the region immediately below the first contact surface,
a length between an end edge of the second drain layer on the second source layer side and a second contact surface between the second drain layer and the second drain electrode in the direction parallel to an upper surface of the semiconductor substrate being equal to a total thickness of the second back gate layer and the second drain layer in a region immediately below the second contact surface.

* * * * *